US009970629B2

(12) United States Patent
Álmosdi et al.

(10) Patent No.: US 9,970,629 B2
(45) Date of Patent: May 15, 2018

(54) REMOTE PHOSPHOR LIGHTING DEVICES AND METHODS

(71) Applicant: GE LIGHTING SOLUTIONS, LLC, East Cleveland, OH (US)

(72) Inventors: Péter Álmosdi, BudaPest (HU); Viktor Zsellér, BudaPest (HU)

(73) Assignee: GE LIGHTING SOLUTIONS, LLC, East Cleveland, OH (US)

( * ) Notice: Subject to any disclaimer, the term of this patent is extended or adjusted under 35 U.S.C. 154(b) by 223 days.

(21) Appl. No.: 14/886,781

(22) Filed: Oct. 19, 2015

(65) Prior Publication Data

US 2017/0108179 A1 Apr. 20, 2017

(51) Int. Cl.

| F21V 5/04 | (2006.01) |
|---|---|
| F21V 7/00 | (2006.01) |
| F21V 9/16 | (2006.01) |
| F21S 8/08 | (2006.01) |
| F21K 9/64 | (2016.01) |
| F21W 131/103 | (2006.01) |
| F21Y 115/10 | (2016.01) |
| F21W 131/10 | (2006.01) |

(52) U.S. Cl.
CPC .............. F21V 5/04 (2013.01); F21K 9/64 (2016.08); F21S 8/085 (2013.01); F21V 7/0091 (2013.01); F21V 9/16 (2013.01); F21W 2131/10 (2013.01); F21W 2131/103 (2013.01); F21Y 2115/10 (2016.08)

(58) Field of Classification Search
CPC ........ F21V 7/0083; F21V 7/0091; F21V 5/04; F21V 9/16; F21K 9/64; F21K 9/56; F21S 8/085; F21Y 2115/10; F21Y 2101/02; F21W 2131/103
See application file for complete search history.

(56) References Cited

U.S. PATENT DOCUMENTS

| 7,869,674 B2 | 1/2011 | Kim et al. |
| 8,354,784 B2 | 1/2013 | Yuan et al. |
| 9,150,784 B1 | 10/2015 | Stoll et al. |

(Continued)

FOREIGN PATENT DOCUMENTS

| EP | 1118883 A2 | 7/2001 |
| JP | 2011113755 A | 6/2011 |
| WO | 2014177607 A1 | 11/2014 |

OTHER PUBLICATIONS

European Search Report and Opinion issued in connection with corresponding European Application No. 16194150.5 dated Jan. 25, 2017.

*Primary Examiner* — David V Bruce
(74) *Attorney, Agent, or Firm* — Peter T. DiMauro; GE Global Patent Operation

(57) ABSTRACT

A lighting device and method generates monochromatic light from one or more light point sources. A phosphor body is spatially separated from the point light source(s) to receive the monochromatic light generated by the first point light source and provide a multi-wavelength light through luminescence. The multi-wavelength light is emitted from the phosphor body across a multi-dimensional surface. Optionally, a lens body can receive the multi-wavelength light from the multi-dimensional surface and both reflect and refract the multi-wavelength light in an exit distribution out of the lens body.

22 Claims, 5 Drawing Sheets

(56) References Cited

U.S. PATENT DOCUMENTS

| | | | |
|---|---|---|---|
| 9,410,675 B1* | 8/2016 | McDermott | F21V 7/0091 |
| 2010/0177495 A1 | 7/2010 | Van et al. | |
| 2011/0121758 A1 | 5/2011 | Bierhuizen et al. | |
| 2013/0088852 A1 | 4/2013 | Kamee et al. | |
| 2015/0176777 A1 | 6/2015 | Hikmet et al. | |
| 2015/0252964 A1* | 9/2015 | Takahashi | F21K 9/60 |
| | | | 362/84 |

* cited by examiner

_US 9,970,629 B2_

REMOTE PHOSPHOR LIGHTING DEVICES AND METHODS

FIELD

Embodiments of the subject matter disclosed herein relate to lighting devices.

BACKGROUND

Some light systems include phophsors that control the distribution of light emanating from the lights. These systems may distribute the light in a Lambertian light distribution. This distribution, however, may not be useful for some outdoor applications. For example, regulations may restrict the types of light distribution that can be used when illuminating roads, crosswalks, etc. The restrictions may not allow Lambertian distributions due to the glare or other visibility problems caused by such distributions.

Additionally, some known outdoor light systems that are allowed to distribute light in Lambertian distributions suffer from poor efficiencies. These light systems may not generate sufficient light to adequately illuminate some outdoor locations, such as roads, parking lots, etc.

BRIEF DESCRIPTION

In one embodiment, a lighting device includes a first point light source configured to generate monochromatic light and a phosphor body spatially separated from the first point light source. The phosphor body is configured to receive the monochromatic light generated by the first point light source and provide a multi-wavelength light through luminescence across a multi-dimensional surface from receipt of the monochromatic light. The lighting device also can include a lens body configured to receive the multi-wavelength light from the multi-dimensional surface and both reflect and refract the multi-wavelength light in an exit distribution out of the lens body.

In another embodiment, another lighting device includes a light source configured to generate first light of a first wavelength and a phosphor body spatially separated from the light source. The phosphor body is configured to receive the first light generated by the light source and provide a multi-wavelength light having at least one different wavelength than the first wavelength across a multi-dimensional surface. The lighting device may include a lens body configured to receive the multi-wavelength light from the multi-dimensional surface and one or more of reflect or refract the multi-wavelength light in an exit distribution out of the lens body.

In another embodiment, a method (e.g., for generating light) includes generating monochromatic light from a first point light source of a lighting device, receiving the monochromatic light generated by the first point light source at a phosphor body that is spatially separated from the first point light source, providing a multi-wavelength light through luminescence of the phosphor body across a multi-dimensional surface from receipt of the monochromatic light, and reflecting and refracting the multi-wavelength light with a lens body that receives the multi-wavelength light from the multi-dimensional surface to direct the multi-wavelength light from the lighting device in an exit distribution out of the lens body.

BRIEF DESCRIPTION OF THE DRAWINGS

The subject matter described herein will be better understood from reading the following description of non-limiting embodiments, with reference to the attached drawings, wherein below.

DETAILED DESCRIPTION

One or more embodiments of inventive subject matter described herein provide for lighting devices and methods that provide an optical-mechanical solution to create a wide angle light distribution with the use of remote phosphor bodies. In one embodiment, instead of white light emitting diodes (LEDs), blue LED chips may be used with a spatially separated phosphor layer (also referred to herein as a phosphor body). The phosphor body receives the light generated by the LED or LEDs and uses the received light to create a wide-angle (e.g., batwing-shaped) light distribution. A lens directs light rays away from a central axis into wide angles.

In one embodiment, a lighting device includes a light source that is an LED generating a single point of monochromatic light, such as blue light having a single wavelength. This light travels across a spatial gap (e.g., an air gap) between the light source and the phosphor body. The phosphor body is larger than the single point of light, and luminesces upon receipt of the light to generate additional light, such as light having multiple wavelengths. The separation between the light source and the phosphor body allows a higher temperature light source to be used and/or extends the useful life of the phosphor body. For example, the spatial gap reduces the heat transferred from the light source to the phosphor body, which can extend how long the phosphor body can continue generating the multi-wavelength light (relative to no spatial gap or a smaller spatial gap). The phosphor body has a light emitting surface that is larger than the surface of the light source from which the monochromatic light is emitting from the light source. This light emitting surface is a multi-dimensional surface that emits light over a larger area for a larger distribution of light relative to the light source. This surface may serve as an inlet into a lens body that reflects and/or refracts the light out of the lighting device. The shape of the lens body may be controlled to dictate the distribution of the light out of the lighting device. In one embodiment, the use of a blue monochromatic LED spatially separated from a phosphor body and/or the inclusion of one or more embodiments of the lens bodies described herein can increase the efficacy of the light emanating from the light device by 10 to 25% (or another value) relative to light devices that include a white LED, that do not include a phosphor body, that include a different lens body, and/or that do not spatially separate the LED from the phosphor body.

Figure 1:
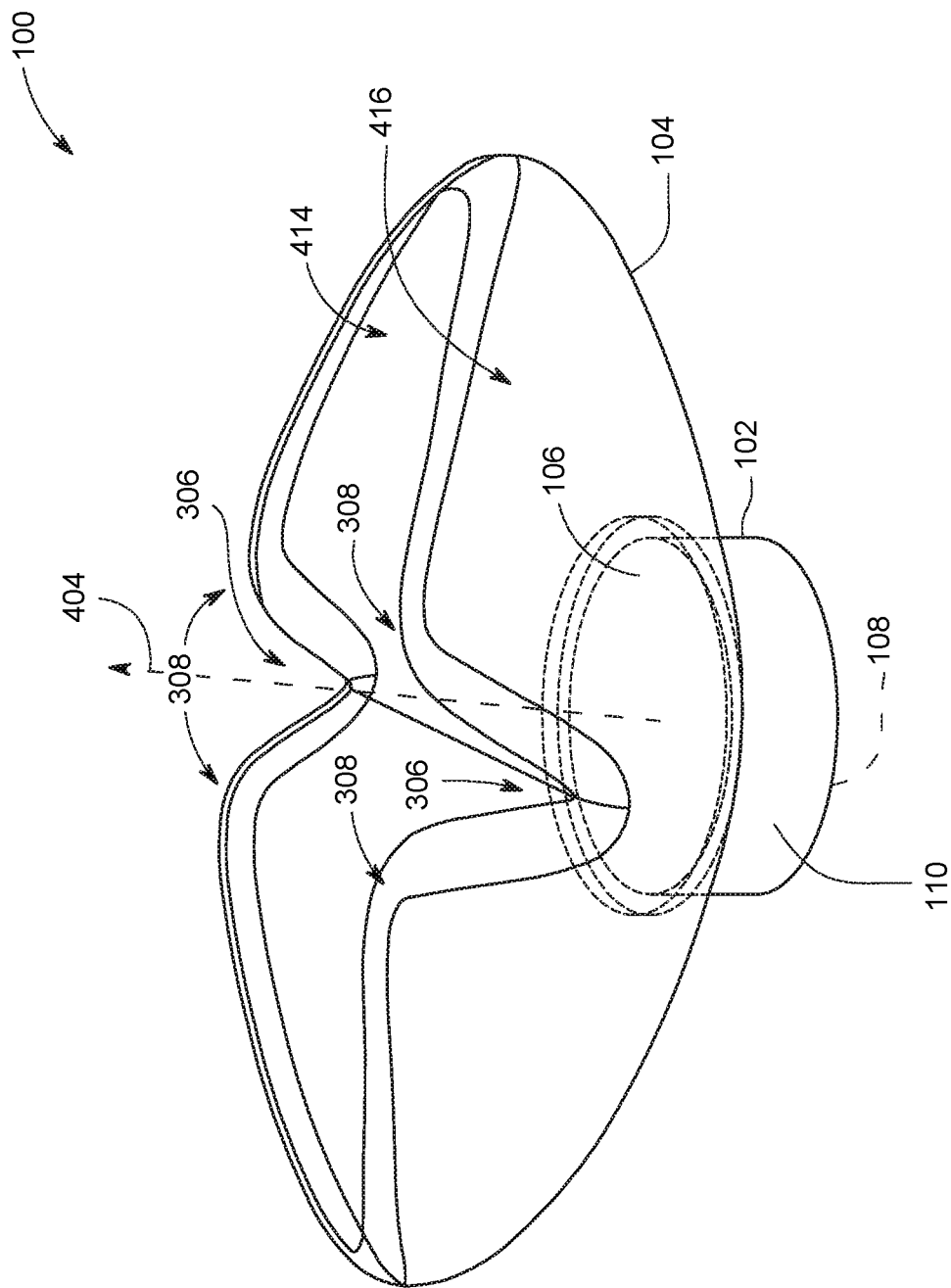
FIG. 1 illustrates one embodiment of a lighting device.

FIG. 1 illustrates one embodiment of a lighting device 100. The lighting device 100 includes a light source housing 102 that is operably connected with a lens body 104. For example, the housing 102 may be connected with the lens body 104. The housing 102 is shown as a cylindrical body having opposite surfaces 106, 108 connected by a cylindrical wall 110. One or both of the surfaces 106, 108 may be planar surfaces or alternatively may have non-planar shapes. One or more light sources are disposed within the housing 102.

The wall 110 and/or surface 108 of the housing 102 may be opaque to the light generated inside the housing 102 while the surface 106 may be transmissive to the light. For example, the surface 106 may be clear. The surface 106 operates as a light inlet or input into the lens body 104, and may be referred to as an exit surface of the housing 102. Light generated inside the housing 102 exits the housing 102 through the surface 106 and enters the lens body 104. The lens body 104 is formed from light transmissive material and is shaped to reflect and/or refract the light received from the housing 102 into a desired or designated distribution.

Figure 2:
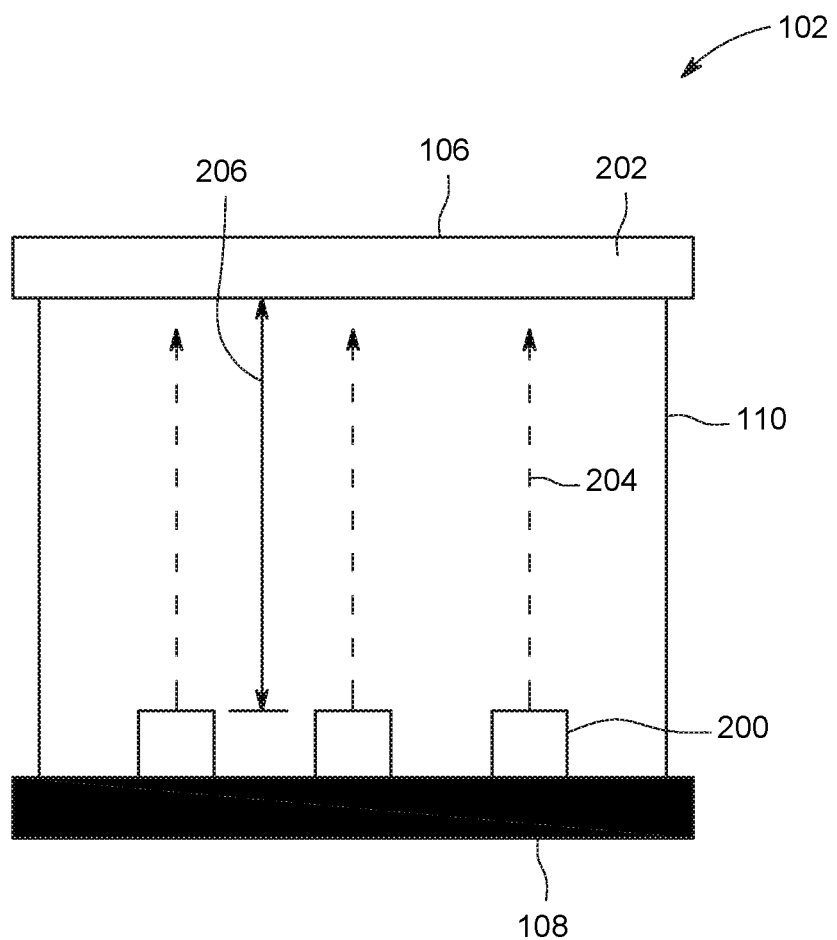
FIG. 2 illustrates a cross-sectional view of a housing of the lighting device shown in FIG. 1 according to one embodiment.

With continued reference to the lighting device 100 shown in FIG. 1, FIG. 2 illustrates a cross-sectional view of the housing 102 of the lighting device 100 shown in FIG. 1 according to one embodiment. The housing 102 includes several light sources 200 disposed closer to the lower surface 108 of the housing 102 than the opposite upper surface 106 of the housing 102. Alternatively, one or more of the light sources 200 may be located elsewhere in the housing 102. The number of light sources 200 shown in FIG. 2 is provided merely as one example. A single light source 200 or another number of the light sources 200 can be included in the lighting device 100.

At least one, or all, of the light sources 200 in the housing 102 are point light sources that generate single points of light instead of generating light distributed over a two dimensional area. The light sources 200 in the housing 102 generate monochromatic light in one embodiment. For example, the light sources 200 may generate light having a single wavelength. All of the light sources 200 in the housing 102 may generate the same monochromatic light (e.g., light having the same wavelength or color). Alternatively, two or more of the light sources 200 in the housing 102 may generate light having different wavelengths or colors. In one aspect, the light sources 200 represent LEDs that emit light having a peak wavelength from 450 nanometers (nm) to 455 nm. Alternatively, the light sources 200 can represent LEDs that emit light having a peak wavelength from 444 nm to 450 nm, from 450 nm to 457 nm, from 444 nm to 457 nm, or another peak wavelength. The term peak wavelength can represent the wavelength of the light generated by a light source 200 having the largest magnitude.

A phosphor body 202 is disposed within the housing 102. The phosphor body 202 may include or otherwise device the surface 106 of the housing 102. The phosphor body 202 shown in FIG. 2 has a disk shape that forms the top of the housing 102. The phosphor body 202 receives the light generated by the light sources 200. This light causes the phosphor body 202 to luminesce and generate additional light. The light generated by the phosphor body 202 may be multi-wavelength light. For example, the phosphor body 202 may receive the single peak wavelength light from the light sources 200 and generate light having multiple wavelengths through luminescence. The phosphor body 202 can emit this multi-wavelength light across the multi-dimensional surface 106 of the phosphor body 202 and the housing 102. The surface 106 may be multi-dimensional in that the surface 106 extends over, and light is emitted across, a two- or three-dimensional surface. For example, an entire area that extends along at least two directions may emit light. As shown in FIG. 2, the surface area of the surface 106 through which the light is emitted from the phosphor body 202 is larger than the surface area of the light sources 200 through which the light generated by the light sources 200 is emitted.

The phosphor body 202 can include a molded polymer in the shape of a flat cylinder, with a phosphor disposed therein. The bulk material of the source disk or cylinder of the phosphor body 202 can be 95% transparent polymer and 5% phosphor. In one embodiment, the bulk material of the phosphor body is formed from Lord E-105 transparent epoxy and Cirkalok 6010B hardener (at a 6:1 mass ratio) with 5% Intematix GAL 550-02-13 phosphor. The phosphor body 202 can convert 450 nm blue light (or other light) received from the light sources 200 into white light having a color correlated temperature (CCT) of 5000K and/or a color rendering index (CRI) of 70. Alternatively, the light may have another color, CCT, and/or CRI.

The phosphor body 202 is spatially separated from the light sources 200. The light sources 200 may generate light along center axes 204 of the light sources 200, and the phosphor body 202 may be spaced apart from the light sources 200 along the axes 204 by a separation gap 206. The gap 206 may be an air gap (e.g., a gap that is filled with air) or a gap filled with another material, such as another gas. The gap 206 allows heat generated by the light sources 200 to dissipate or be reduced prior to reaching the phosphor body 202. This can prevent the phosphor body 202 from being heated or otherwise damaged by the light sources 200, which would otherwise reduce the useful life of the phosphor body 202.

In one embodiment, the side of the gap 206 may be much larger than the wavelength of the light emitted by the light sources 200 and/or than the light sources 200. The size of the gap 206 may be measured along a direction that is coextensive with one or more of the center axes 204. The size of the gap 206 can be several centimeters (e.g., two to five centimeters), or another size.

The light emitted by the phosphor body 202 enters the lens body 104 through the surface 106 of the housing 102. The lens body 104 may be formed from a light transmissive material, such as epoxy or another material. The lens body 104 reflects and/or refracts the received light into an exit distribution of the light emanating from the lighting device 100. The shape of the lens body 104 may be varied to provide different exit distributions of the light.

Figure 3:
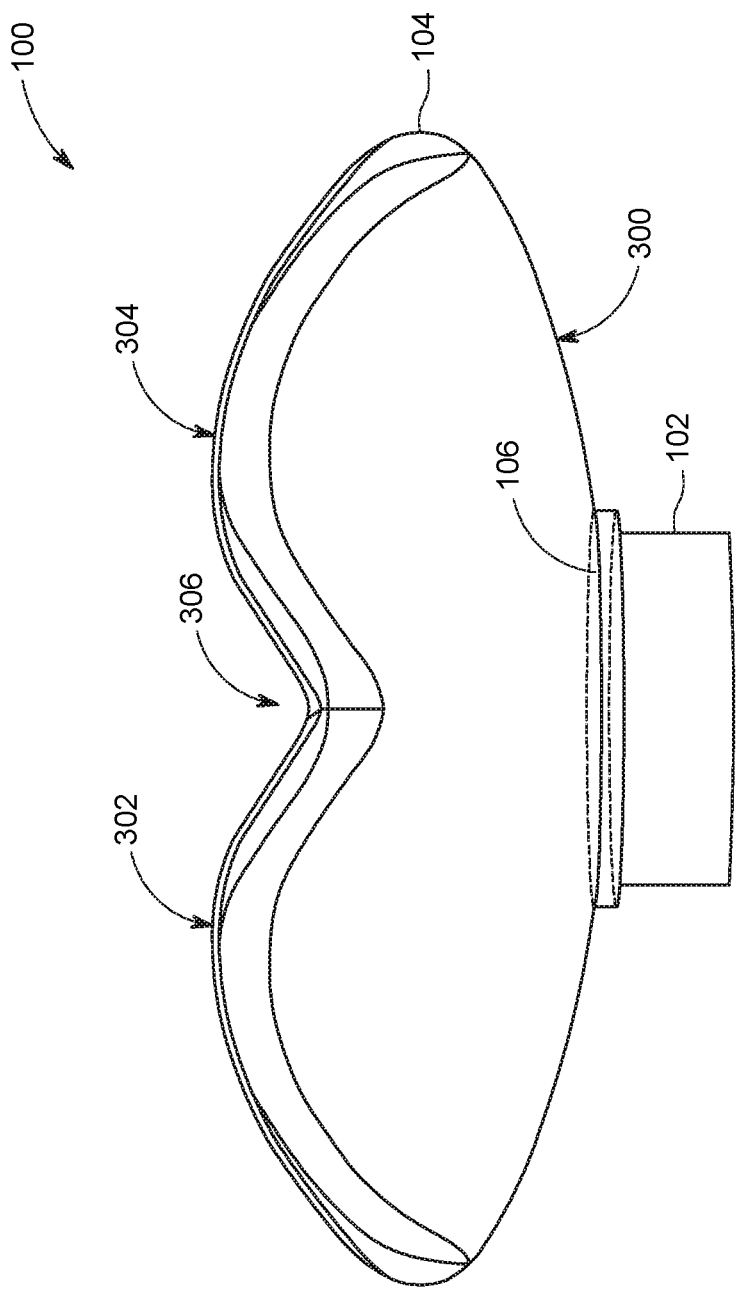
FIG. 3 illustrates a side view of the lighting device shown in FIG. 1 according to one embodiment.

FIG. 3 illustrates a side view of the lighting device 100 shown in FIG. 1 according to one embodiment. The lens body 104 of the lighting device 100 has a shape that receives the light from the phosphor body 202 via the surface 106 and changes a distribution of the light into a non-Lambertian distribution. The lens body 104 includes a convex surface 300 and plural opposing convex surfaces 302, 304. The radius or radii of curvature of the convex surfaces 302, 304 may be smaller than the radius or radii of curvature of the convex surface 300. The convex surface 300 may have an opening or hole through which the housing 102 is inserted. The light emanating from the phosphor body 202 of the housing 102 can enter into the lens body 104 through this opening or hole.

The lens body 104 has a saddle shape with the convex surfaces 302, 304 separated from each other by a valley 306. As shown in FIG. 1, the convex surfaces 302, 304 can form four peaks 308, but alternatively may form another number of peaks 308. Also as shown in FIG. 1, the lens body 104 may have a clamshell shape formed from two opposing sides 414, 416. Each side 414, 416 of the clamshell shape of the lens body 104 includes two peaks 308 separated by the valley 306.

The convex surface 300 may be referred to as a converging surface as the surface 300 reflects and/or refracts the light in the lens body 104 to converge the light. For example, beams of light that strike the surface 300 may be focused to converge toward a location, such as the opposite convex surfaces 302, 304. The convex surfaces 302, 304, in contrast, are divergent surfaces. The surfaces 302, 304 reflect and/or refract the light in the lens body 104 to diverge the light. For example, beams of light that strike the surface 302 and/or the surface 304 may be directed away from a location, such as the opposite convex surface 300.

The surfaces 300, 302, 304 may be shaped to provide for total internal reflection of the light. For example, light may emanate from the surface 106 of the housing 102 at a variety of angles relative to the surface 106. The radii of curvature of the surfaces 302, 304 may be small enough to cause light that is incident upon the surfaces 302, 304 to be reflected inward (e.g., toward the opposite surface 300). The surface 300 may reflect the light internally as well to cause the light to be directed out of the lens body 104 (e.g., between the surfaces 302, 304 and the peaks 308, as shown in FIG. 1).

Figure 4:
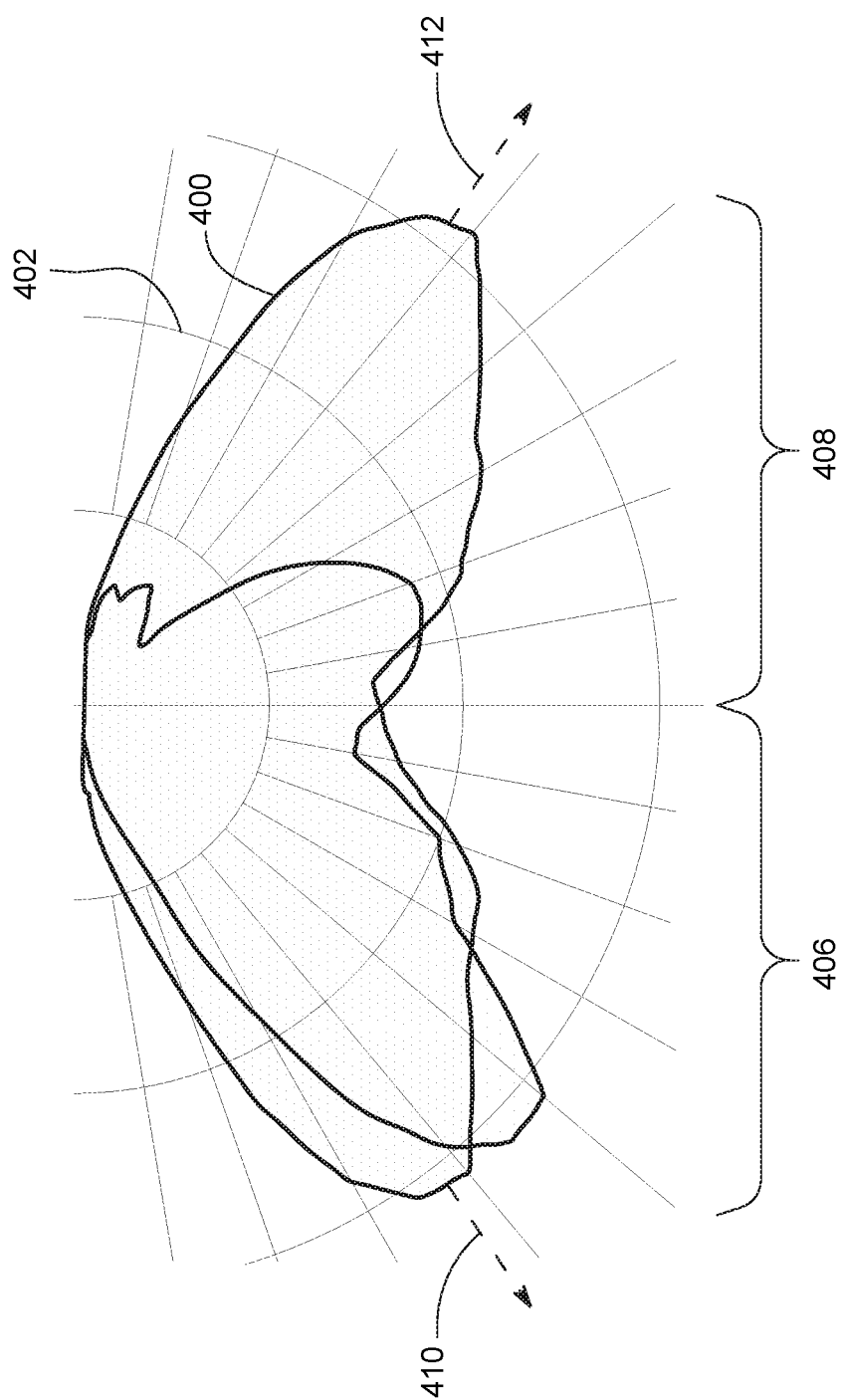
FIG. 4 illustrates an exit distribution of the light emanating from the lighting device shown in FIG. 1 according to one example.

FIG. 4 illustrates an exit distribution 400 of the light emanating from the lighting device 100 shown in FIG. 1 according to one example. The distribution 400 is shown on a radiation diagram 402 representative of different luminous intensity levels of the light emanating from the lighting device 100 at different angles from a center axis 404 (shown in FIG. 1) of the lighting device 100. As shown in FIG. 4, the distribution 400 is a non-Lambertian distribution. For example, the distribution 400 of light is not equal in all directions or angles from the center axis 404 of the lighting device 100. The distribution 400 has a batwing shape in that the distribution 400 includes two approximately oval shaped portions 406, 408 that are elongated along transversely oriented directions 410, 412. Alternatively, the distribution 400 may have another shape.

Figure 5:
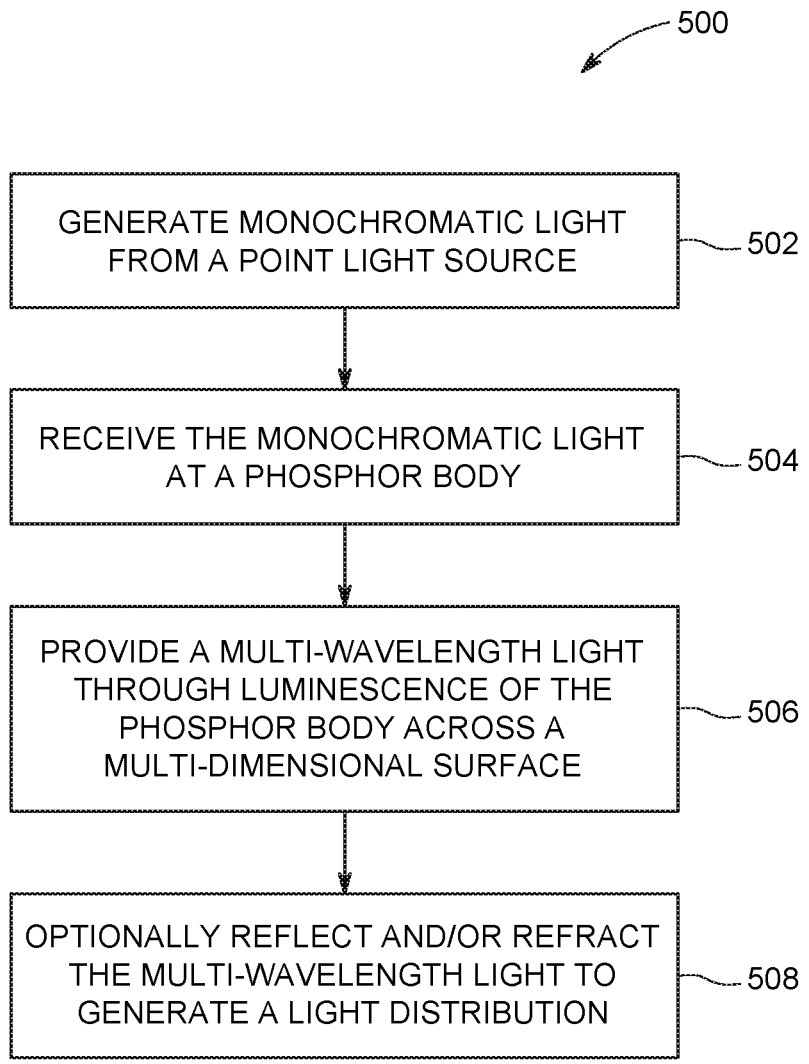
FIG. 5 illustrates a flowchart of one embodiment of a method for generating light from a lighting device.

FIG. 5 illustrates a flowchart of one embodiment of a method 500 for generating light from a lighting device. The method 500 may describe operation of the lighting device 100 shown in FIG. 1 or may describe operation of another lighting device. At 502, monochromatic light is generated from one or more point light sources. At 504, this light is received at a phosphor body. As described above, the phosphor body may be spaced apart from the point light sources to prevent heating of the phosphor body by the light sources. At 506, a multi-wavelength light is provided via luminescence of the phosphor body. This multi-wavelength light is emitted across a multi-dimensional surface. For example, the phosphor body can convert the points of light from the point light sources into light that emanates from the phosphor body across a two- or three-dimensional surface. At 508, the light that emanates from the phosphor body is reflected and/or refracted by a lens body to generate a designated distribution of the light. Optionally, 508 may not be included in the method 500. The light can be reflected and/or refracted to generate a distribution of the light that is not a Lambertian distribution.

In one embodiment, a lighting device includes a first point light source configured to generate monochromatic light and a phosphor body spatially separated from the first point light source. The phosphor body is configured to receive the monochromatic light generated by the first point light source and provide a multi-wavelength light through luminescence across a multi-dimensional surface from receipt of the monochromatic light. The lighting device also can include a lens body configured to receive the multi-wavelength light from the multi-dimensional surface and both reflect and refract the multi-wavelength light in an exit distribution out of the lens body.

In one aspect, the first point light source is a light emitting diode.

In one aspect, the lighting device also includes one or more second point light sources configured to generate additional monochromatic light.

In one aspect, the phosphor body also is spatially separated from the one or more second point light sources and is configured to receive the additional monochromatic light from the one or more second point light sources. The phosphor body also can be configured to provide the multi-wavelength light through luminescence from receipt of the monochromatic light and the additional monochromatic light.

In one aspect, the phosphor body is spatially separated from the first point light source by an air gap.

In one aspect, the phosphor body is configured to emit the multi-wavelength light from the multi-dimensional surface having a surface area larger than the first point light source.

In one aspect, the first point light source is configured to generate a blue light as the monochromatic light.

In one aspect, the lens body is configured to reflect and refract the multi-wavelength light in a non-Lambertian distribution as the exit distribution.

In one aspect, the lighting device also includes a cylindrical housing in which the first point light source and the phosphor body are disposed. The cylindrical housing can include a circular exit surface that defines the multi-dimensional surface through which the multi-wavelength light is directed into the lens body. The lens body can include a convergent convex surface and opposing divergent convex surfaces with the multi-wavelength light received into the lens body toward the divergent convex surfaces and away from the convergent convex surface.

In one aspect, the convergent convex surface and the divergent lens surfaces of the lens body provide for total internal reflection of the multi-wavelength light.

In another embodiment, another lighting device includes a light source configured to generate first light of a first wavelength and a phosphor body spatially separated from the light source. The phosphor body is configured to receive the first light generated by the light source and provide a multi-wavelength light having at least one different wavelength than the first wavelength across a multi-dimensional surface. The lighting device may include a lens body configured to receive the multi-wavelength light from the multi-dimensional surface and one or more of reflect or refract the multi-wavelength light in an exit distribution out of the lens body.

In one aspect, the light source is configured to generate the first light as a monochromatic light.

In one aspect, the light source is a point light source configured to generate the first light as a point of light.

In one aspect, the lighting device also includes one or more additional point light sources configured to generate additional second light.

In one aspect, the phosphor body also is spatially separated from the light source and the one or more additional point light sources and to receive the additional second light from the one or more additional point light sources. The phosphor body also can be configured to provide the multi-wavelength light through luminescence from receipt of the first light and the additional second light.

In one aspect, the phosphor body is spatially separated from the light source by an air gap.

In one aspect, the phosphor body is configured to emit the multi-wavelength light from the multi-dimensional surface having a surface area larger than a surface of the light source through which the first light is emitted from the light source.

In one aspect, the lighting device also includes a cylindrical housing in which the light source and the phosphor body are disposed. The cylindrical housing can have a circular exit surface that defines the multi-dimensional surface through which the multi-wavelength light is directed into the lens body.

In one aspect, the lens body includes a convergent convex surface and opposing divergent convex surfaces with the multi-wavelength light received into the lens body toward the divergent convex surfaces and away from the convergent convex surface.

In another embodiment, a method (e.g., for generating light) includes generating monochromatic light from a first point light source of a lighting device, receiving the monochromatic light generated by the first point light source at a phosphor body that is spatially separated from the first point light source, providing a multi-wavelength light through luminescence of the phosphor body across a multi-dimensional surface from receipt of the monochromatic light, and reflecting and refracting the multi-wavelength light with a lens body that receives the multi-wavelength light from the multi-dimensional surface to direct the multi-wavelength light from the lighting device in an exit distribution out of the lens body.

In one aspect, generating the monochromatic light includes generating additional monochromatic light with one or more second point light sources of the lighting device and receiving the additional monochromatic light at the phosphor body.

In one aspect, receiving the monochromatic light includes receiving the monochromatic light after the monochromatic light has traversed an air gap between the phosphor body and the first point light.

In one aspect, reflecting and refracting the multi-wavelength light includes reflecting and refracting the multi-wavelength light in a non-Lambertian distribution as the exit distribution.

The foregoing description of certain embodiments of the inventive subject matter will be better understood when read in conjunction with the appended drawings. The various embodiments are not limited to the arrangements and instrumentality shown in the drawings. The above description is illustrative and not restrictive. For example, the above-described embodiments (and/or aspects thereof) may be used in combination with each other. In addition, many modifications may be made to adapt a particular situation or material to the teachings of the inventive subject matter without departing from its scope. While the dimensions and types of materials described herein are intended to define the parameters of the inventive subject matter, they are by no means limiting and are exemplary embodiments. Other embodiments may be apparent to one of ordinary skill in the art upon reviewing the above description. The scope of the inventive subject matter should, therefore, be determined with reference to the appended claims, along with the full scope of equivalents to which such claims are entitled.

In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure. And, as used herein, an element or step recited in the singular and proceeded with the word "a" or "an" should be understood as not excluding plural of said elements or steps, unless such exclusion is explicitly stated. Furthermore, references to "one embodiment" of the inventive subject matter are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

This written description uses examples to disclose several embodiments of the inventive subject matter and also to enable a person of ordinary skill in the art to practice the embodiments of the inventive subject matter, including making and using any devices or systems and performing any incorporated methods. The patentable scope of the inventive subject matter is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

What is claimed is:

1. A lighting device comprising:
   a first point light source configured to generate monochromatic light;
   a phosphor body spatially separated from the first point light source, the phosphor body configured to receive the monochromatic light generated by the first point light source and provide a multi-wavelength light through luminescence across a multi-dimensional surface from receipt of the monochromatic light; and
   a lens body configured to receive the multi-wavelength light from the multi-dimensional surface and both reflect and refract the multi-wavelength light in an exit distribution out of the lens body.

2. The lighting device of claim 1, further comprising one or more second point light sources configured to generate additional monochromatic light.

3. The lighting device of claim 2, wherein the phosphor body also is spatially separated from the one or more second point light sources and to receive the additional monochromatic light from the one or more second point light sources, the phosphor body also configured to provide the multi-wavelength light through luminescence from receipt of the monochromatic light and the additional monochromatic light.

4. The lighting device of claim 1, wherein the phosphor body is spatially separated from the first point light source by an air gap.

5. The lighting device of claim 1, wherein the phosphor body is configured to emit the multi-wavelength light from the multi-dimensional surface having a surface area larger than the first point light source.

6. The lighting device of claim 1, wherein the lens body is configured to reflect and refract the multi-wavelength light in a non-Lambertian distribution as the exit distribution.

7. The lighting device of claim 1, further comprising a cylindrical housing in which the first point light source and the phosphor body are disposed, the cylindrical housing having a circular exit surface that defines the multi-dimensional surface through which the multi-wavelength light is directed into the lens body.

8. The lighting device of claim 1, wherein the lens body includes a convergent convex surface and opposing divergent convex surfaces with the multi-wavelength light received into the lens body toward the divergent convex surfaces and away from the convergent convex surface.

9. The lighting device of claim 8, wherein the convergent convex surface and the divergent lens surfaces of the lens body provide for total internal reflection of the multi-wavelength light.

10. The lighting device of claim 1, wherein the first point light source configured to generate monochromatic light is a blue LED configured to generate blue light.

11. A lighting device comprising:
a blue LED configured to generate blue light of a first wavelength;
a phosphor body spatially separated from the blue LED, the phosphor body configured to receive the blue light generated by the blue LED and provide a multi-wavelength light having at least one different wavelength than the first wavelength across a multi-dimensional surface; and
a lens body configured to receive the multi-wavelength light from the multi-dimensional surface and one or more of reflect or refract the multi-wavelength light in a non-Lambertian distribution out of the lens body.

12. The lighting device of claim 11, wherein the blue LED is configured to generate the blue light as a monochromatic light.

13. The lighting device of claim 11, wherein the blue LED is configured to generate the blue light having a peak wavelength from 444 nm to 457 nm.

14. The lighting device of claim 11, further comprising one or more additional light sources configured to generate additional second light.

15. The lighting device of claim 11, wherein the phosphor body is spatially separated from the blue LED by an air gap.

16. The lighting device of claim 11, wherein the phosphor body is configured to emit the multi-wavelength light from the multi-dimensional surface having a surface area larger than a surface of the blue LED through which the light is emitted from the blue LED.

17. The lighting device of claim 11, further comprising a cylindrical housing in which the blue LED and the phosphor body are disposed, the cylindrical housing having a circular exit surface that defines the multi-dimensional surface through which the multi-wavelength light is directed into the lens body.

18. The lighting device of claim 11, wherein the non-Lambertian distribution is a batwing-shaped distribution.

19. A lighting device comprising:
a first blue LED configured to generate blue light;
a phosphor body spatially separated from the blue LED, the phosphor body configured to receive the blue light generated by the blue LED and provide a multi-wavelength light through luminescence across a multi-dimensional surface from receipt of the blue light; and
a lens body configured to receive the multi-wavelength light from the multi-dimensional surface and both reflect and refract the multi-wavelength light in an exit distribution out of the lens body.

20. The lighting device of claim 19, wherein the lens body is configured to reflect and refract the multi-wavelength light in a batwing-shaped distribution as the exit distribution.

21. The lighting device of claim 19, further comprising a cylindrical housing in which the first blue LED and the phosphor body are disposed, the cylindrical housing having a circular exit surface that defines the multi-dimensional surface through which the multi-wavelength light is directed into the lens body.

22. The lighting device of claim 19, wherein the lens body includes a convergent convex surface and opposing divergent convex surfaces with the multi-wavelength light received into the lens body toward the divergent convex surfaces and away from the convergent convex surface, and wherein the convergent convex surface and the divergent lens surfaces of the lens body provide for total internal reflection of the multi-wavelength light.

* * * * *